(12) United States Patent
Erickson et al.

(10) Patent No.: US 9,051,638 B2
(45) Date of Patent: Jun. 9, 2015

(54) IN-SITU SPUTTERING APPARATUS

(71) Applicant: Poole Ventura, Inc., Oxnard, CA (US)

(72) Inventors: Mark R. Erickson, Newbury Park, CA (US); Henry J. Poole, Ventura, CA (US); Arthur W. Custer, III, Oxnard, CA (US); Ady Hershcovitch, Mount Sinai, NY (US)

(73) Assignees: POOLE VENTURA, INC., Oxnard, CA (US); BROOKHAVEN SCIENCE ASSOCIATES, LLC, Upton, NY (US)

( * ) Notice: Subject to any disclaimer, the term of this patent is extended or adjusted under 35 U.S.C. 154(b) by 0 days.

(21) Appl. No.: 13/782,270

(22) Filed: Mar. 1, 2013

(65) Prior Publication Data

US 2014/0246313 A1    Sep. 4, 2014

(51) Int. Cl.
C23C 14/35 (2006.01)
C23C 14/04 (2006.01)
H01J 37/32 (2006.01)

(52) U.S. Cl.
CPC ............. C23C 14/046 (2013.01); C23C 14/351 (2013.01); C23C 14/35 (2013.01); H01J 37/32669 (2013.01)

(58) Field of Classification Search
CPC ........................... H01J 37/32669; C23C 14/35
See application file for complete search history.

(56) References Cited

U.S. PATENT DOCUMENTS

| | | | |
|---|---|---|---|
| 4,221,652 A * | 9/1980 | Kuriyama | 204/298.22 |
| 6,344,114 B1 | 2/2002 | Sichmann et al. | |
| 6,379,575 B1 | 4/2002 | Yin et al. | |
| 6,462,334 B1 * | 10/2002 | Little et al. | 250/281 |
| 6,585,870 B1 | 7/2003 | Pitcher et al. | |
| 6,692,568 B2 | 2/2004 | Cuomo et al. | |
| 7,588,667 B2 | 9/2009 | Cerio, Jr. | |
| 7,850,871 B2 | 12/2010 | Jiang et al. | |
| 7,939,172 B2 | 5/2011 | Gorokhovsky et al. | |
| 8,221,909 B2 | 7/2012 | Aytug et al. | |
| 8,362,220 B2 | 1/2013 | Girolami et al. | |
| 2002/0096430 A1 * | 7/2002 | Lupton et al. | 204/298.12 |
| 2004/0140204 A1 | 7/2004 | Navala et al. | |
| 2007/0144891 A1 * | 6/2007 | Henrich et al. | 204/192.11 |
| 2007/0297954 A1 | 12/2007 | Santilli | |
| 2010/0243440 A1 | 9/2010 | Miller | |

FOREIGN PATENT DOCUMENTS

JP        59197570 A  * 11/1984
WO   WO 2007032858      3/2007

OTHER PUBLICATIONS

PCT International Search Report; mailed Jul. 15, 2013; PCT International Application No. PCT/US13/35374.

* cited by examiner

*Primary Examiner* — Jason M Berman
(74) *Attorney, Agent, or Firm* — Hall Estill Attorneys at Law; Daniel P. Dooley

(57) ABSTRACT

A sputtering apparatus that includes at least a target presented as an inner surface of a confinement structure, the inner surface of the confinement structure is preferably an internal wall of a circular tube. A cathode is disposed adjacent the internal wall of the circular tube. The cathode preferably provides a hollow core, within which a magnetron is disposed. Preferably, an actuator is attached to the magnetron, wherein a position of the magnetron within the hollow core is altered upon activation of the actuator. Additionally, a carriage supporting the cathode and communicating with the target is preferably provided, and a cable bundle interacting with the cathode and linked to a cable bundle take up mechanism provided power and coolant to the cathode, magnetron, actuator and an anode of the sputtering apparatus.

18 Claims, 9 Drawing Sheets
(9 of 9 Drawing Sheet(s) Filed in Color)

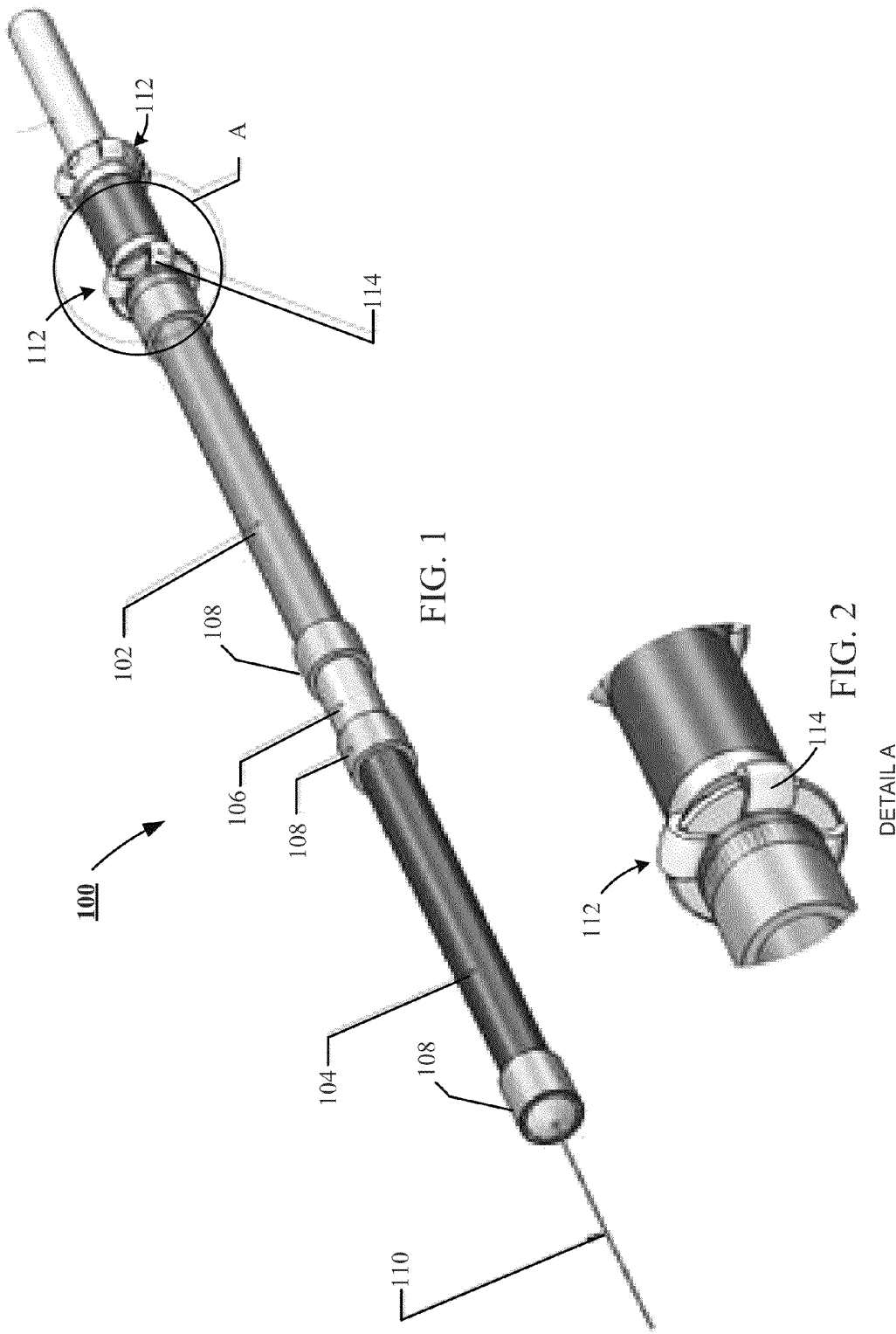

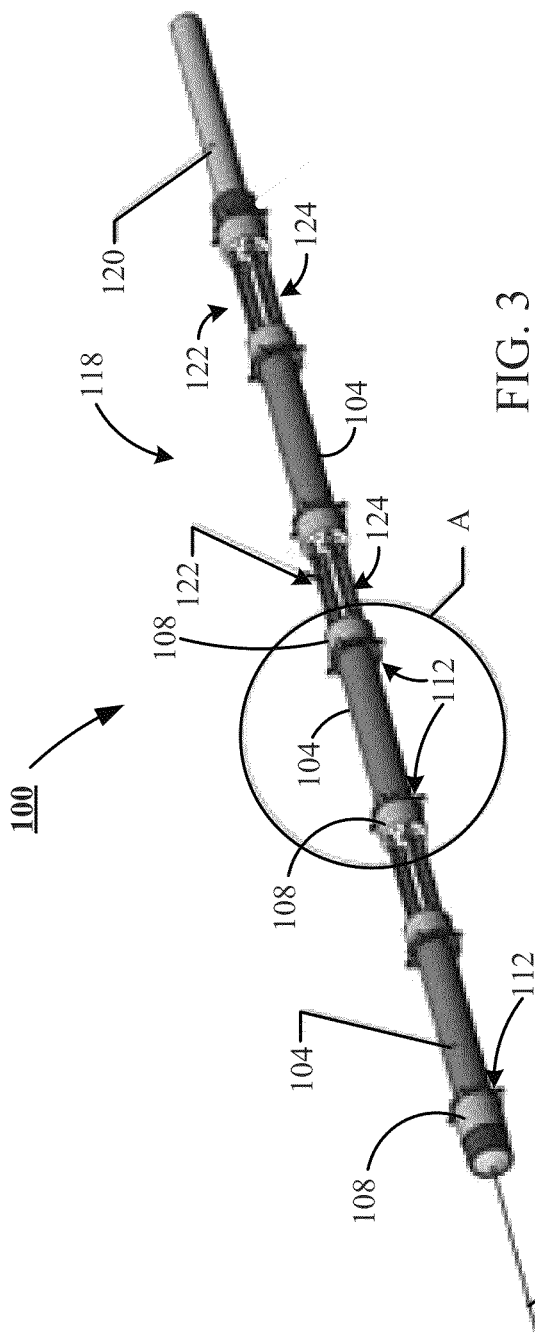
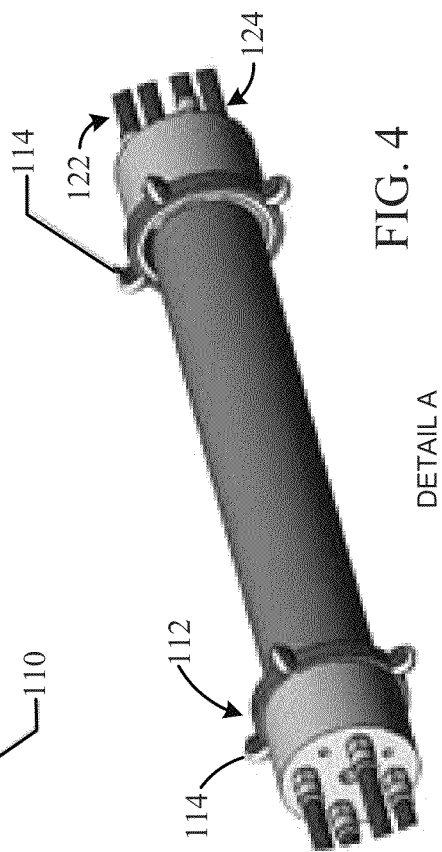
FIG. 3
FIG. 4
DETAIL A

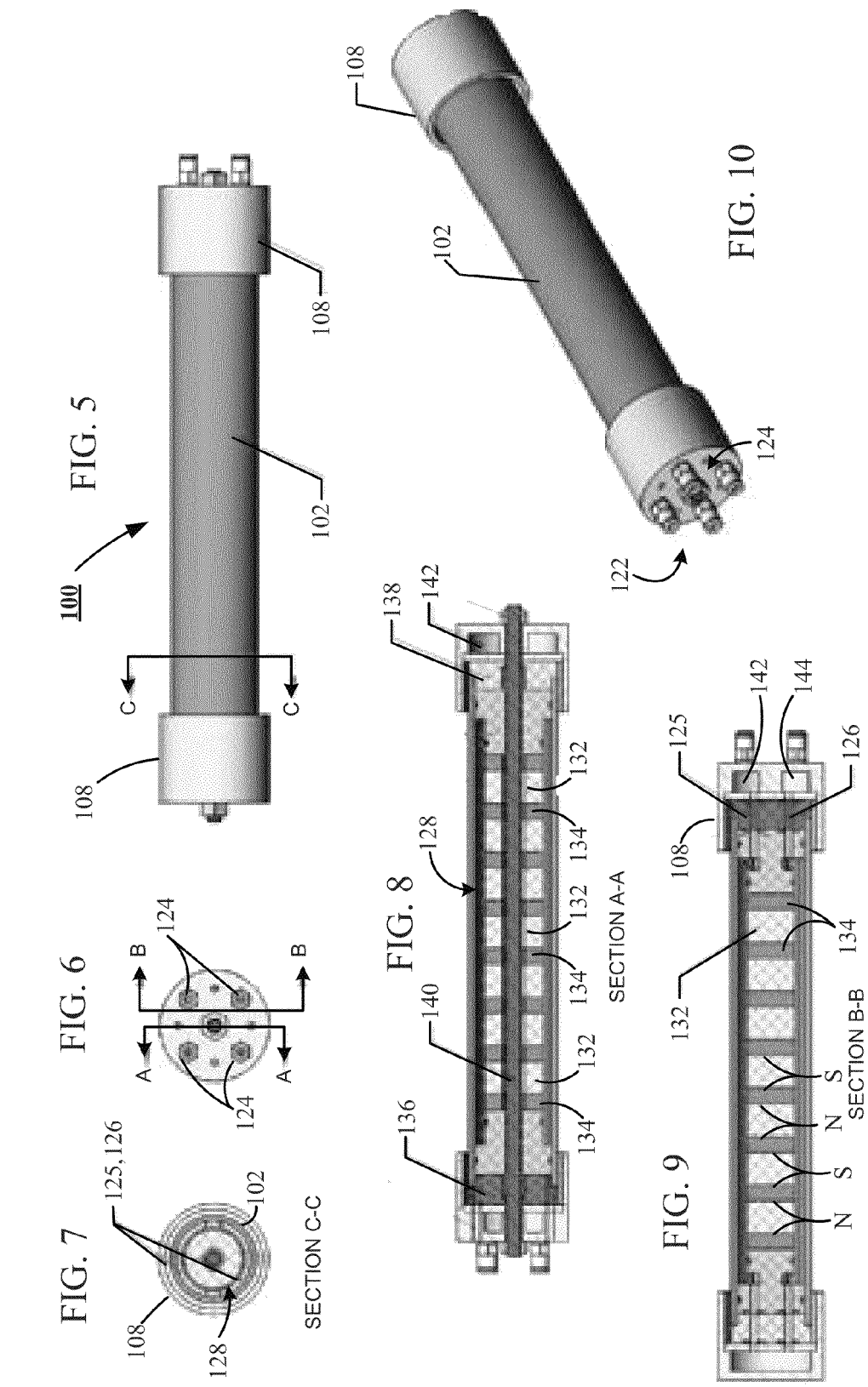

IN-SITU SPUTTERING APPARATUS

STATEMENT RE: FEDERALLY SPONSORED RESEARCH/DEVELOPMENT

This invention was made with Government support under contract number DE-AC02-98CH10886, awarded by the U.S. Department of Energy. The Government has certain rights in the invention.

FIELD OF THE INVENTION

The claimed invention relates to the field of in-situ sputtering apparatus and methods of using same for cold bore tubes, and more particularly to sputtering apparatus and methods of coating the inner bore of stainless steel tubes.

SUMMARY OF THE INVENTION

The present disclosure relates to in-situ sputtering apparatus and methods of using same for cold bore tubes, and more particularly to sputtering apparatus and methods of coating the inner bore of stainless steel tubes.

In accordance with various exemplary embodiments, a sputtering apparatus includes at least a target presented as an inner surface of a confinement structure, a cathode adjacent the target, wherein the cathode provides a hollow core. Preferably, the inner surface of the confinement structure is an internal wall of a circular tube, and the hollow core of the cathode provides space for a magnetron disposed within the hollow core. The sputtering apparatus further preferably includes an actuator communicating with the magnetron, wherein a position of the magnetron within the hollow core is altered upon activation of the actuator. In a preferred embodiment, a carriage supporting the cathode and communicating with the target is provided to facilitate translation of the magnetron within the cathode, and a cable bundle interacting with the cathode provides power and coolant to the cathode. Still further, the sputtering apparatus preferably includes in the exemplary embodiment, a cable bundle take up mechanism secured to the cable bundle on an end of the cable bundle distal from the end of the cable bundle communicating with the cathode.

In an alternate exemplary embodiment, a sputtering apparatus includes at least a target presented as an inner surface of a confinement structure, a cathode adjacent the target, wherein the cathode provides a hollow core. Preferably, the inner surface of the confinement structure is an internal wall of a circular tube, and the hollow core of the cathode provides space for a magnetron disposed within the hollow core. The sputtering apparatus further preferably includes an actuator communicating with the magnetron, wherein a position of the magnetron within the hollow core is altered upon activation of the actuator. In a preferred embodiment, a carriage supporting the cathode and communicating with the target is provided to facilitate translation of the magnetron within the cathode, and a cable bundle interacting with the cathode provides power and coolant to the cathode. Still further, the sputtering apparatus preferably includes in the exemplary embodiment, a cable bundle take up mechanism secured to the cable bundle on an end of the cable bundle distal from the end of the cable bundle communicating with the cathode, and in which the magnetron includes at least a plurality of magnets, each of the plurality of magnets having a pair of substantially parallel external side surfaces, a main body portion disposed between the pair of substantially parallel external side surfaces, the main body portion having an external surface disposed between and substantially non-perpendicular to the pair of substantially parallel external surfaces, and wherein the actuator rotates the magnetron relative to the cathode.

These and various other features and advantages that characterize the claimed invention will be apparent upon reading the following detailed description and upon review of the associated drawings.

BRIEF DESCRIPTION OF THE DRAWINGS

The patent or application file contains at least one drawing executed in color. Copies of this patent with color drawing(s) will be provided by the Patent and Trademark Office upon request and payment of necessary fee.

FIG. 1 displays an orthogonal projection of an exemplary embodiment of a sputtering apparatus of the claimed invention.

FIG. 2 provides an orthogonal projection of an exemplary carriage of the sputtering apparatus of FIG. 1.

FIG. 3 shows an orthogonal projection of an exemplary embodiment of an in-line plurality sputtering apparatus of the claimed invention of FIG. 1.

FIG. 4 illustrates an orthogonal projection of a pair of exemplary carriages of the sputtering apparatus of FIG. 3.

FIG. 5 provides a side view in elevation of the sputtering apparatus of FIG. 1.

FIG. 6 displays an end view in elevation of the sputtering apparatus of FIG. 5.

FIG. 7 shows a cross section end view in elevation of the sputtering apparatus of FIG. 5.

FIG. 8 illustrates a cross section view in elevation of the sputtering apparatus of FIG. 5.

FIG. 9 provides an alternate cross section view in elevation of the sputtering apparatus of FIG. 5.

FIG. 10 displays an orthogonal projection of an exemplary embodiment of a sputtering apparatus of FIG. 5.

DETAILED DESCRIPTION OF AN EXEMPLARY EMBODIMENT OF THE DRAWINGS

Figure 11:
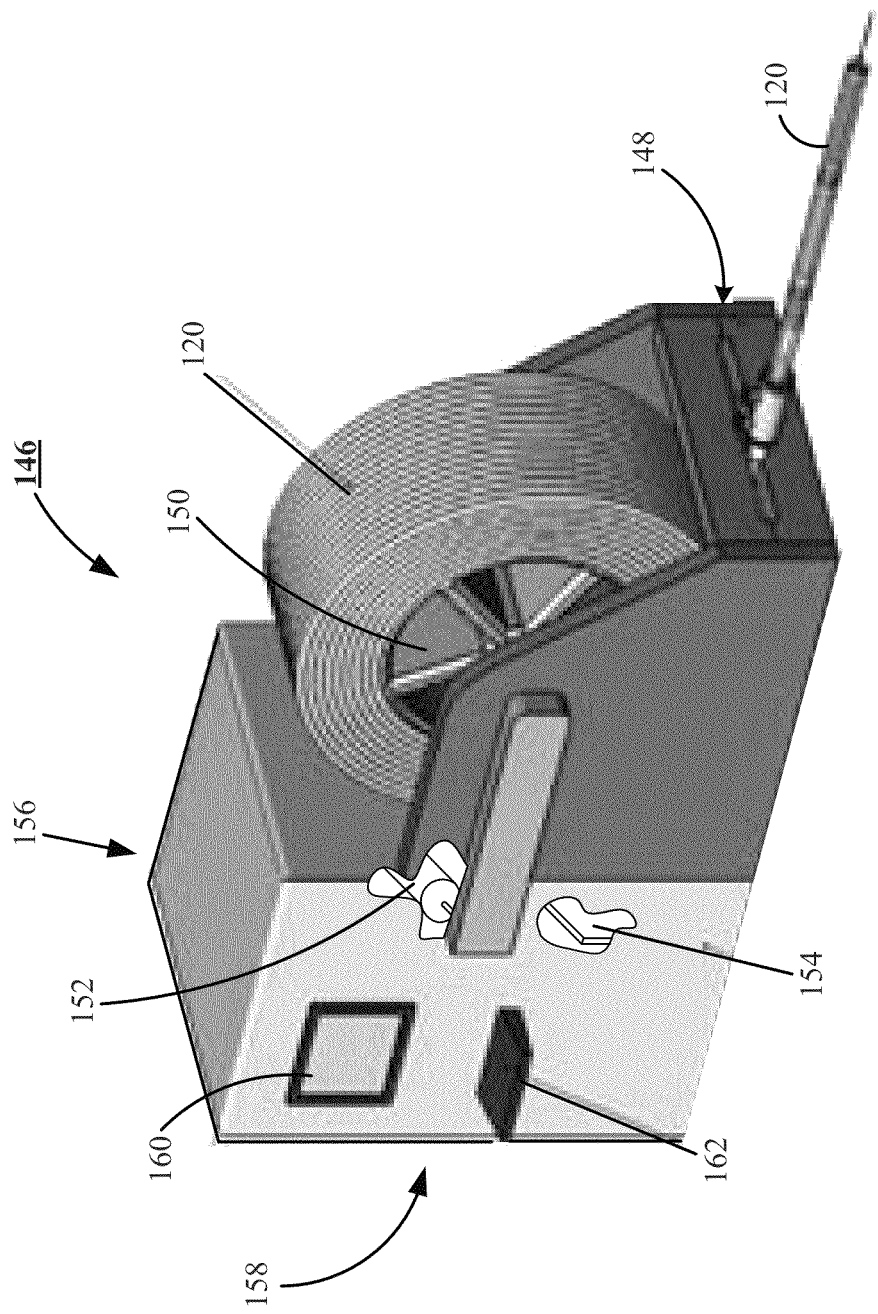
FIG. 11 shows an orthogonal projection of a cable bundle take up mechanism, configured to cooperate with the sputtering apparatus of FIG. 3.

Reference will now be made in detail to one or more examples of various embodiments of the present invention depicted in the figures. Each example is provided by way of explanation of the various embodiments of the present invention, and not meant as a limitation of the invention. For example, features illustrated or described as part of one embodiment may be used with another embodiment to yield still a different embodiment. Other modifications and variations to the described embodiments are also contemplated within the scope and spirit of the claimed invention.

Turning to the drawings, FIG. 1 displays an exemplary sputtering apparatus 100 which includes at least a first cathode 102, preferably formed from copper, a second cathode 104, preferably formed from graphite, an insulator 106 disposed between the graphite and copper cathodes (102, 104), and a plurality of anodes 108. In a preferred embodiment, the sputtering apparatus 100 further includes an attached drag line 110 adjacent an end anode 108, and a carriage 112. Preferably, the carriage 112 provides a plurality of rotational mechanisms 114, which may take the form of crowned rollers, as shown by FIG. 2, or wheels as shown by FIG. 4, supported by a carriage 112, and in turn supporting a process chamber 106.

FIG. 3 shows an exemplary alternate embodiment, which includes a plurality of cathode and anode pairs 118, strung together in a linear fashion, a conduit bundle 120 secured to a proximal end of the plurality of cathode and anode pairs 118, and the attached drag line 110 adjacent an end anode 108, on the distal end of the plurality of cathode and anode pairs 118. In a preferred embodiment, the conduit bundle 120 (also referred to herein as cable bundle 120) houses at least power leads 122 and coolant lines 124, which are visibly shown disposed between each of the pairs of the plurality of cathode and anode pairs 118. FIG. 3 further shows a plurality of carriages 112, each adjacent the plurality of anodes 108.

The cross-sectional, front view of the sputtering apparatus 100 shown by FIG. 5 provides a more detailed depiction of inlet and outlet coolant channels (125, 126) formed between a magnet assembly 128 (of FIG. 8), and the cathode 102, while FIG. 6 shows an end view in elevation, delineating the power leads 122, from the coolant lines 124. FIG. 7 provides a side view in elevation, and reference of orientation for the section view C-C, shown by FIG. 5. FIG. 6 further provides a reference for section view A-A, of FIG. 8, and section view B-B of FIG. 9 respectively, and FIG. 10 provides perspective view of the power leads 122, and the coolant lines 124, relative to the anode 108.

Figure 15:
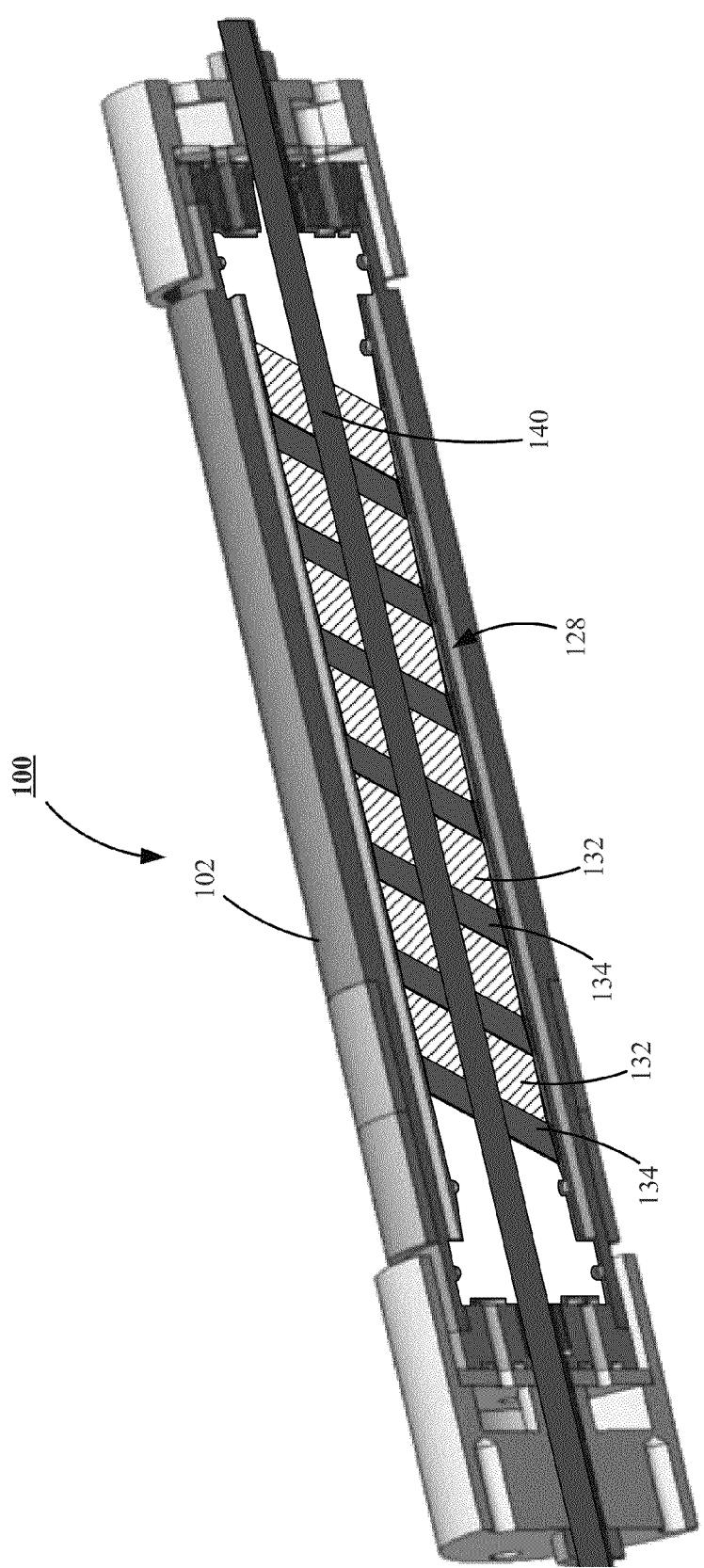
FIG. 15 shows a cross section view in an orthogonal projection of an alternate preferred embodiment of a magnetron of the sputtering apparatus of FIG. 1.

Returning to FIG. 8, shown therein is the magnet assembly 128, which includes at least a plurality of insulators 132, disposed between a plurality of magnets 134. Preferably, each of the plurality of magnets 134 are arranged such that the faces of adjacent magnets have common polarities, i.e., north to north, and south to south, as depicted in FIG. 9, which helps focus the magnetic flux field. FIG. 8 further shows that the magnet assembly 128 preferably includes a front cap 136, an end cap 138, and a draw bolt 140 extending through the plurality of magnets 134 and the plurality of insulators 132. In a preferred embodiment, the draw bolt 140, maintains the faces of the adjacent magnets 134, substantially perpendicular to the cathode 102, as shown by FIG. 8, while in an alternate preferred embodiment, the draw bolt 140, maintains the faces of the adjacent magnets 134, substantially non-perpendicular to the cathode 102, as shown by FIG. 15. Preferably, the adjacent magnets 134, shown in both FIGS. 8 and 15, have circular face, the adjacent magnets 134 shown by FIG. 15 are aligned such that the circular faces are non-perpendicular relative to the draw bolt 140, and cathode 102.

Continuing with FIGS. 9 and 11, in a preferred embodiment, shown by FIG. 9, the anode 108 provides an inlet coolant cavity 144 communicating with the inlet coolant channel 125, and an outlet coolant cavity 142 communicating with the outlet coolant channel 126. In a preferred embodiment, shown by FIG. 11, the sputtering apparatus 100 further includes at least a cable bundle take up mechanism 146, secured to the cable bundle 120. The cable bundle take up mechanism 146 preferably includes at least: a conduit guide and tensioning mechanism 148, cooperating with the cable bundle 120; a spool 150 communicating with the cable bundle 120; a motor 152 cooperating with the spool 150; a motor controller 154 communicating with the motor 152; a cabinet 156 housing the motor 152, the motor controller 154, and the spool 150; and an operator interface 158, including at least a monitor 160 and keyboard 162, interfacing with the motor controller 154.

Figure 12:
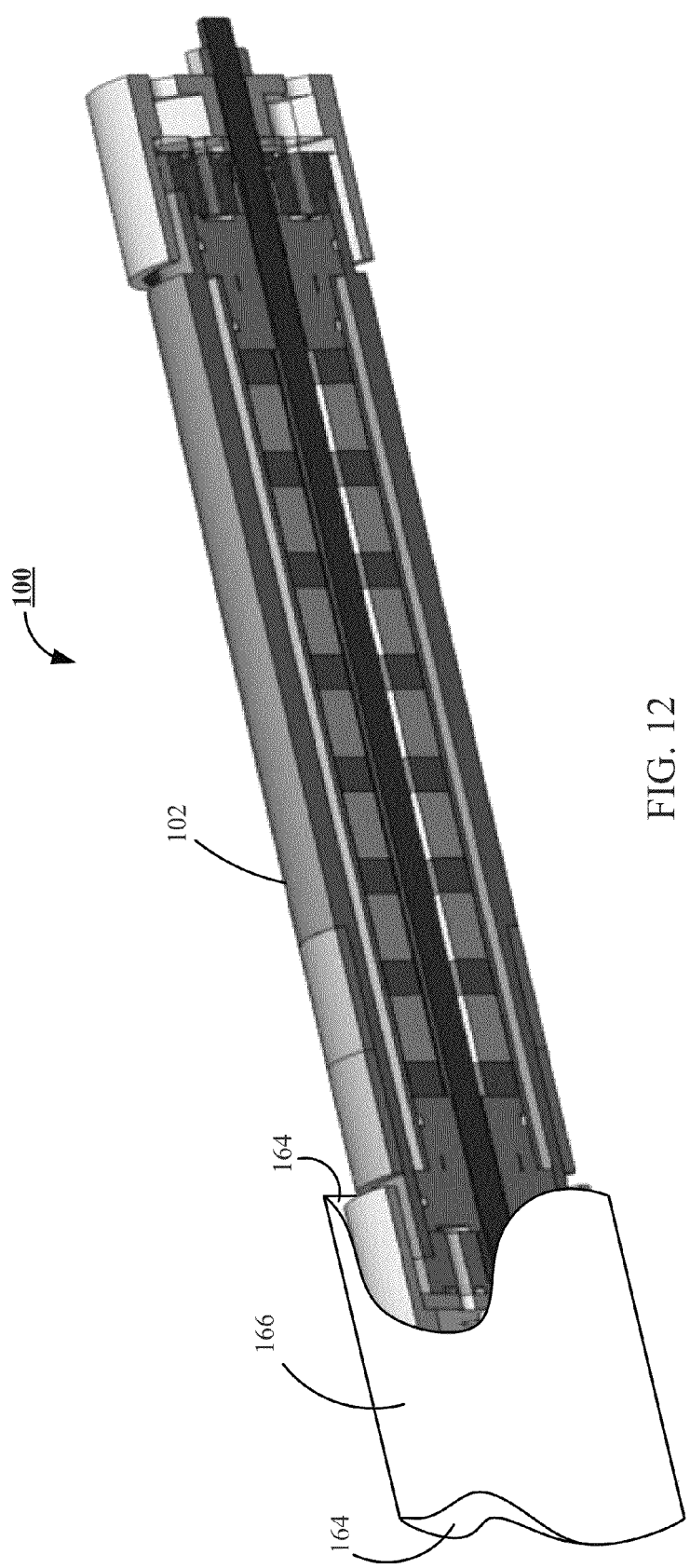
FIG. 12 illustrates a partial cross section in an orthogonal projection of the exemplary embodiment of a sputtering apparatus of FIG. 1, communicating with a target of the claimed invention.

FIG. 12 shows the sputtering apparatus 100 includes a target 164, which preferably is an inner surface of an elongated confinement structure 166 having a cylindrical shape. Any geometric shape of the elongated confinement structure 166 is suitable for interaction with the cathode 102. For example, the geometric shape of the elongated confinement structure 166 may be a rectangular cylinder, a hexagonal cylinder, a trapezoidal cylinder, a triangular cylinder, an octagonal cylinder, or other shape. However, in a preferred embodiment, the geometric shape of the elongated confinement structure 166 is cylinder having a circular cross section.

Figure 13:
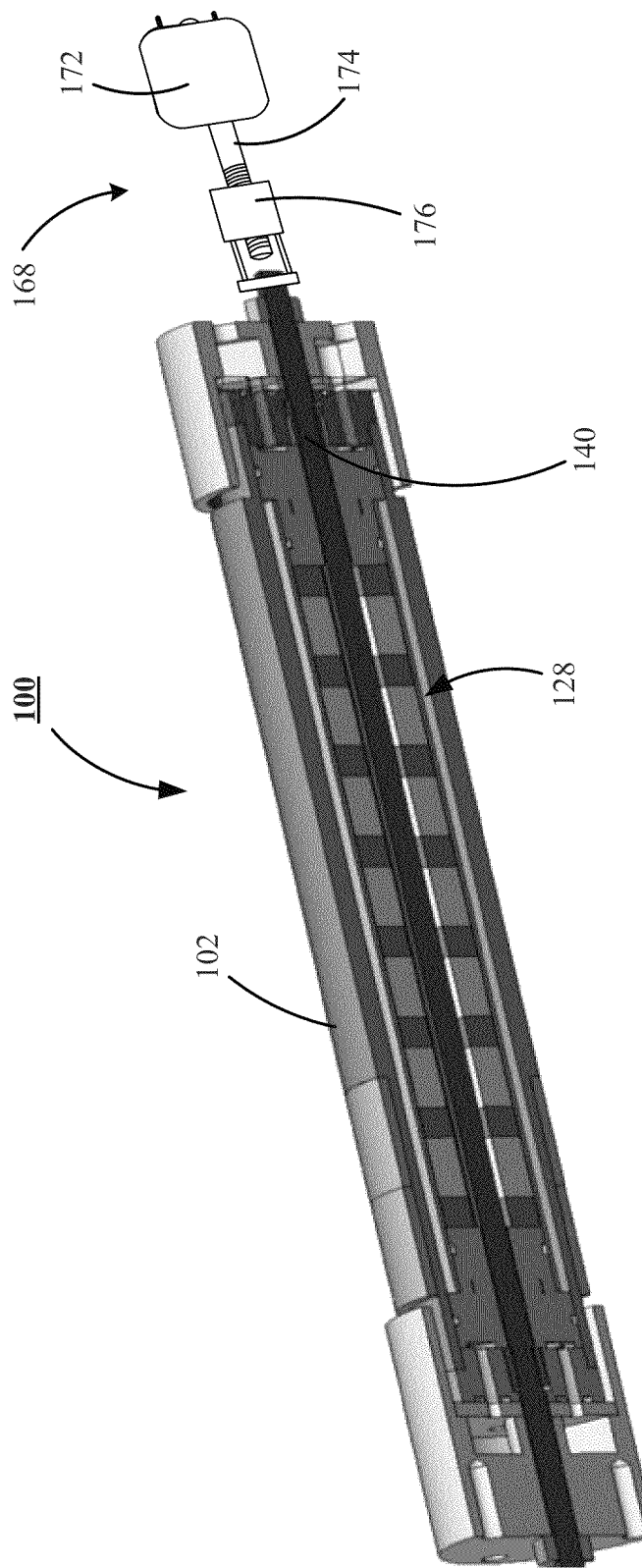
FIG. 13 provides a partial cross section in an orthogonal projection of the exemplary embodiment of a sputtering apparatus of FIG. 1, communicating with a preferred actuator of the claimed invention.
Figure 14:
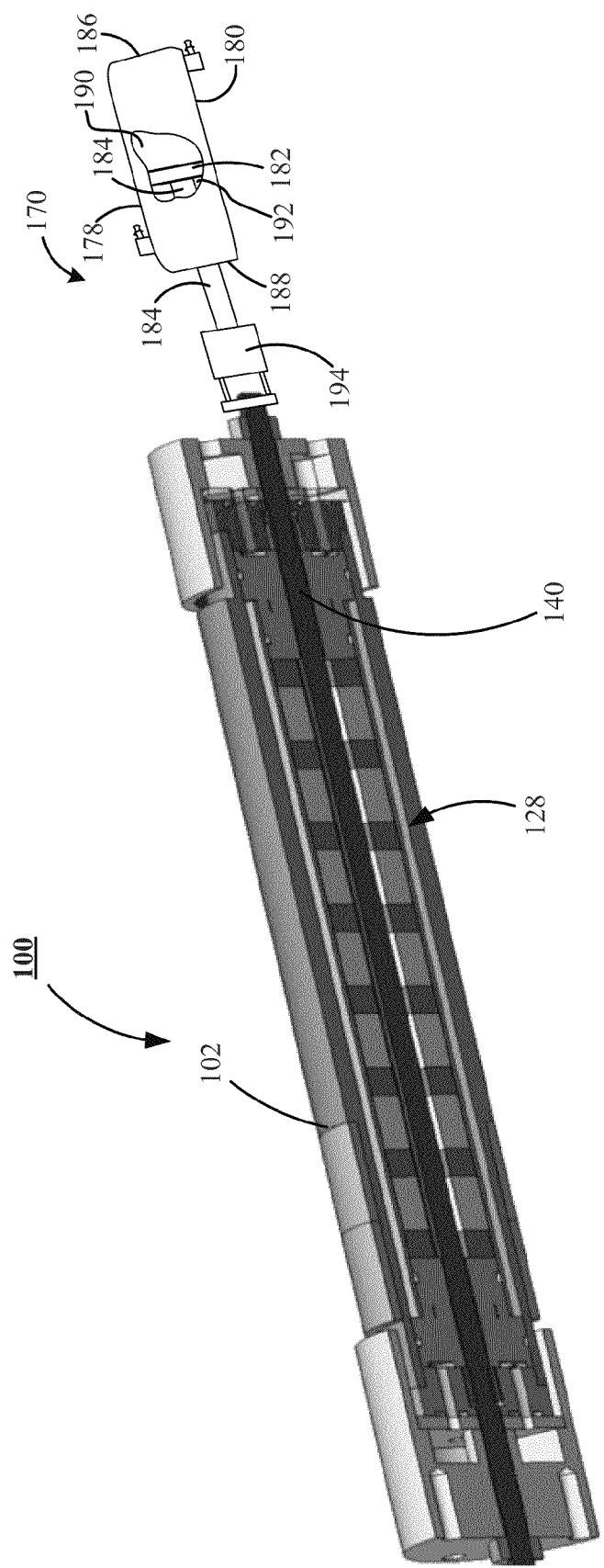
FIG. 14 displays a partial cross section in an orthogonal projection of the exemplary embodiment of a sputtering apparatus of FIG. 1, communicating with an alternate preferred actuator of the claimed invention.

FIGS. 13 and 14 show alternate preferred embodiments of an actuator 168 and 170 respectively. The actuator 168 preferably includes at least an actuator motor 172, communicating with a screw drive 174, and an end effecter 176 that is coupled to the magnet assembly 128 and the end effecter 176. In a preferred embodiment, an activation of the actuator motor 172, imparts a rotation of the screw drive 174. The rotation of the screw drive 174 translated to a linear motion of the end effecter 176, which shifts the position of the magnet assembly 128, internal to the cathode 102. Preferably, the actuator motor 172 is a direct current motor, but could alternatively be a pneumatic motor, a rotary hydraulic motor, a stepper motor, or other rotational output type of motor.

The actuator 170, of FIG. 14, preferably includes at least a fluidic cylinder 178, preferably the fluidic cylinder 178 includes at least a cylinder barrel 180, in which a piston 182 is connected to a piston rod 184 that moves back and forth. The cylinder barrel 180 is preferably closed on one end by the cylinder bottom 186 (also called the cap 186) and the other end by the cylinder head 188 (also called the gland 188) where the piston rod 184, comes out of the cylinder barrel 180. In a preferred embodiment, the piston 182 has sliding rings and seals. The piston 182, divides the inside of the cylinder barrel 180 into two chambers, the bottom chamber 190 (cap 186 end) and the piston rod side chamber 192 (rod end/cylinder head 188 end). In a preferred embodiment, the piston rod 184, communicates with an end effecter 194 that is coupled to the magnet assembly 128. Preferably, an activation of the fluidic cylinder 178 imparts a linear motion on the piston rod 184. The linear motion of the piston rod 184 translated to a linear motion of the end effecter 194, which shifts the position of the magnet assembly 128, internal to the cathode 102.

Figure 16:
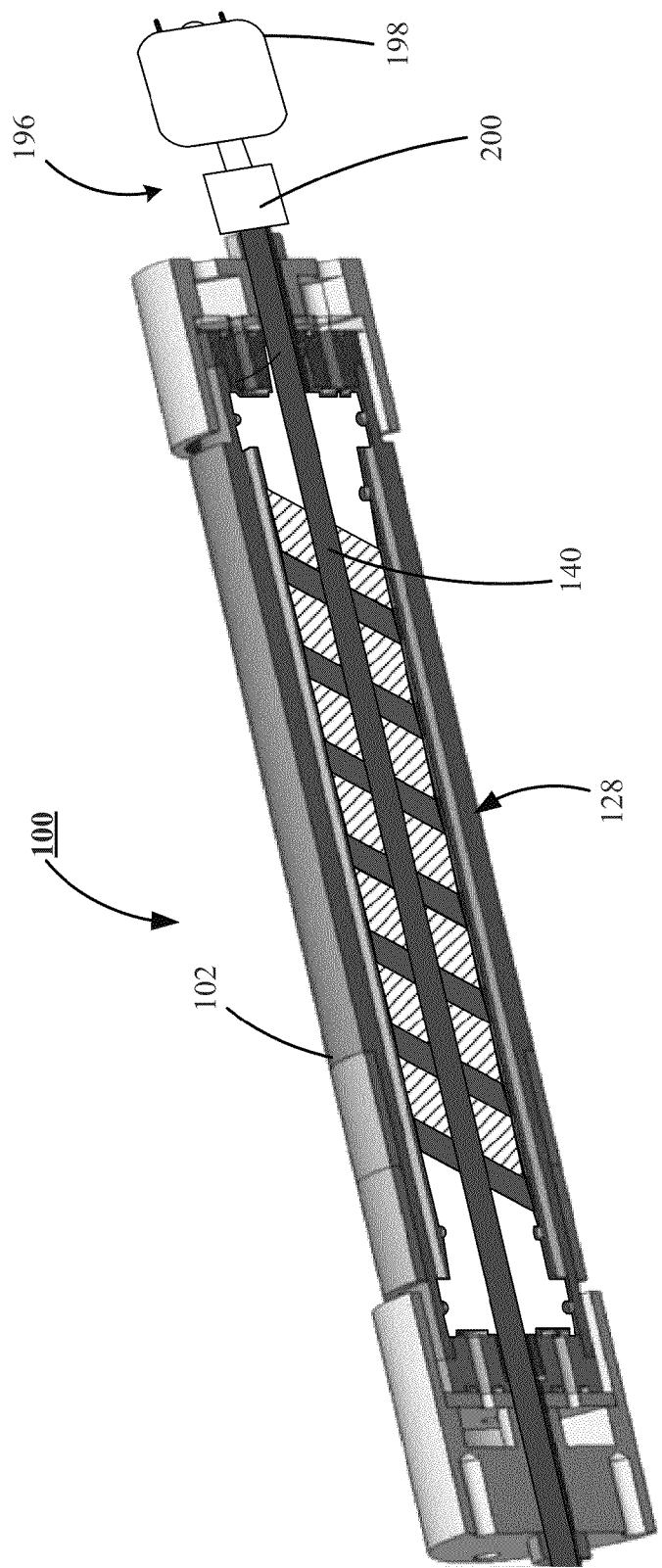
FIG. 16 illustrates a cross section view in an orthogonal projection of the alternate preferred embodiment of the magnetron of the sputtering apparatus of FIG. 15, communicating with an alternative preferred actuator of the claimed invention.

FIG. 16 shows an additional alternate preferred embodiment of an actuator 196, which preferably includes at least an actuator motor 198, communicating with a load adapter 200. Preferably, the load adapter 200 is disposed between and coupled to the actuator motor 198 and the magnet assembly 128. In a preferred embodiment, an activation of the actuator motor 198, imparts a rotation of the load adapter 200, which translates a rotational motion to the magnet assembly 128 that rotates the position of the magnet assembly 128, internal to the cathode 102. Preferably, the actuator motor 198 is a direct current motor, but could alternatively be a pneumatic motor, a rotary hydraulic motor, a stepper motor, or other rotational output type of motor.

It is to be understood that even though numerous characteristics and advantages of various embodiments of the present invention have been set forth in the foregoing description, together with details of the structure and function of various embodiments of the invention, this detailed description is illustrative only, and changes may be made in detail, especially in matters of structure and arrangements of parts within the principles of the present claimed invention to the full extent indicated by the broad general meaning of the terms in which the appended claims are expressed. For example, the particular elements may vary depending on the particular application without departing from the spirit and scope of the present claimed invention.

It will be clear that the present invention is well adapted to attain the ends and advantages mentioned as well as those inherent therein. While presently preferred embodiments have been described for purposes of this disclosure, numerous changes may be made which will readily suggest themselves to those skilled in the art and which are encompassed by the appended claims.

What is claimed is:

1. A sputtering apparatus comprising;
   a target presented as an inner surface of a confinement structure;
   a cathode adjacent the target, the cathode providing a hollow core, in which the cathode includes at least a first cathode, a second cathode, and an insulator disposed between the first and second cathode, the hollow core cathode presents an elongated cylinder, and wherein the first cathode is formed from copper, and in which the elongated cylinder is cylindrical, having a circular cross section, the second cathode is formed from graphite, and wherein the insulator; the first cathode; and the second cathode line in a sequential linear order;
   a magnetron disposed within the hollow core;
   an actuator communicating with the magnetron, wherein a position of the magnetron within the hollow core is altered upon activation of the actuator;
   a carriage supporting the cathode and communicating with the target;
   a cable bundle interacting with the cathode; and
   a cable bundle take up mechanism secured to the cable bundle.

2. The sputtering apparatus of claim 1, in which the confinement structure presents an elongated cylinder.

3. The sputtering apparatus of claim 2, in which the elongated cylinder is cylindrical, having a circular cross section.

4. The sputtering apparatus of claim 1, in which the magnetron comprised a plurality of magnets.

5. The sputtering apparatus of claim 4, in which the plurality of magnets having, a circular cross section.

6. The sputtering apparatus of claim 5, in which the plurality of magnets each have a pair of substantially parallel external side surfaces, a main body portion disposed between the pair of substantially parallel external side surfaces, the main body portion having an external surface disposed between and substantially perpendicular to the pair of substantially parallel external surfaces.

7. The sputtering apparatus of claim 6, in which the plurality of magnets each have a substantially circular cross section.

8. The sputtering apparatus of claim 7, in which the confinement structure presents an elongated cylinder, and in which the actuator is a linear actuator, the linear actuator moves the magnetron in a linear path substantially parallel to the elongated cylinder.

9. The sputtering apparatus of claim 1, in which the actuator is a linear actuator, the linear actuator moves the magnetron in a linear path substantially parallel to the inner surface of a confinement structure.

10. The sputtering apparatus of claim 9, in which the linear actuator comprises a direct current motor attached to the magnetron.

11. The sputtering apparatus of claim 9, in which the linear actuator comprises a lead screw attached to the magnetron.

12. The sputtering apparatus of claim 9, in which the linear actuator comprises a fluidic cylinder attached to the magnetron.

13. The sputtering apparatus of claim 1, further comprising a coolant channel disposed between an external surface of the magnetron and an internal surface of the cathode.

14. The sputtering apparatus of claim 1, in which the cable bundle comprises a coolant line adjacent power conductors, the coolant line and power conductors enclosed by a conduit.

15. The sputtering apparatus of claim 1, in which the carriage comprises a rotational mechanism that supports the cathode a predetermined distance from the target.

16. The sputtering apparatus of claim 15, in which the predetermined distance the cathode is supported from the target is not greater than four centimeters, and in which the rotational mechanism is a wheel mounted on a spring suspension.

17. The sputtering apparatus of claim 14, in which the cable bundle take up mechanism comprises:
   a spool communicating with the conduit;
   a motor cooperating with the spool;
   a motor controller communicating with the motor;
   a cabinet housing the motor and spool;
   a conduit guide and tensioning, mechanism interacting with the conduit, the cabinet, and the spool; and
   an operator interface including at least a monitor and keyboard interfacing with the motor controller.

18. A sputtering apparatus comprising:
   a target presented as an inner surface of as confinement structure;
   a cathode adjacent the target, the cathode providing a hollow core, in which the cathode includes at least a first cathode, a second cathode, and an insulator disposed between the first and second cathode;
   a magnetron disposed within the hollow core;
   an actuator communicating with the magnetron, wherein a position of the magnetron within the hollow core is altered upon activation of the actuator;
   a carriage supporting the cathode and communicating with the target;
   a cable bundle interacting with the cathode; and
   a cable bundle take up mechanism secured to the cable bundle, in which the magnetron comprised a plurality of magnets, each of the plurality of magnets have a pair of substantially parallel external side surfaces, a main body portion disposed between the pair of substantially parallel external side surfaces, the main body portion having an external surface disposed between and substantially non-perpendicular to the pair of substantially parallel external surfaces, and wherein the actuator rotates the magnetron relative to the cathode.

* * * * *